US011282573B2

(12) United States Patent
Manfre' et al.

(10) Patent No.: US 11,282,573 B2
(45) Date of Patent: Mar. 22, 2022

(54) NON-VOLATILE MEMORY DEVICE HAVING A READING CIRCUIT OPERATING AT LOW VOLTAGE

(71) Applicant: STMicroelectronics S.r.l., Agrate Brianza (IT)

(72) Inventors: Davide Manfre', Pandino (IT); Laura Capecchi, Vedano al Lambro (IT); Marcella Carissimi, Treviolo (IT); Marco Pasotti, Travaco' Siccomario (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/904,869

(22) Filed: Jun. 18, 2020

(65) Prior Publication Data
US 2020/0411090 A1  Dec. 31, 2020

(30) Foreign Application Priority Data
Jun. 26, 2019 (IT) .................. 102019000010155

(51) Int. Cl.
  *G11C 11/00*    (2006.01)
  *G11C 13/00*    (2006.01)
(52) U.S. Cl.
  CPC ........ *G11C 13/004* (2013.01); *G11C 13/0004* (2013.01); *G11C 13/0026* (2013.01); *G11C 13/0038* (2013.01); *G11C 2013/005* (2013.01)
(58) Field of Classification Search
  CPC ............. G11C 13/004; G11C 13/0004; G11C 13/0026; G11C 13/0038; G11C 2013/005; G11C 8/10; G11C 2207/002; G11C 5/147; G11C 7/14; G11C 2013/0045

USPC ......................................................... 365/163
See application file for complete search history.

(56) References Cited

U.S. PATENT DOCUMENTS

| 2010/0110768 A1 | 5/2010 | Choi | |
| 2011/0188289 A1* | 8/2011 | Chevallier | G11C 13/0069 365/148 |
| 2013/0148406 A1* | 6/2013 | Shimakawa | G11C 11/1673 365/148 |

(Continued)

OTHER PUBLICATIONS

Lai, Chien-An, et al., "Logic Process Compatible 40nm 256K×144 Embedded RRAM with Low Voltage Current Limiter and Ambient Compensation Scheme to Improve the Read Window", IEEE Asian Solid-State Circuits Conference, Nov. 5-7, 2018, Tainan, Taiwan, 5 pages.

*Primary Examiner* — Tha-O H Bui
(74) *Attorney, Agent, or Firm* — Slater Matsil, LLP

(57) ABSTRACT

A non-volatile memory device includes a memory array, a reading circuit, a column decoder stage, and a read supply voltage generator. The column decoder stage includes selectable bitlines and selection switches. A read supply voltage generator includes a voltage regulation circuit and a dummy column decoder coupled to an output of the voltage regulation circuit and having electrical characteristics correlated to the selected read path. The voltage regulation circuit is configured to receive a first electrical quantity correlated to a desired voltage value on the selected bitline and a second electrical quantity correlated to a desired current value for the selected bitline and to generate a regulated read supply voltage for the column decoder stage.

23 Claims, 4 Drawing Sheets

(56) References Cited

U.S. PATENT DOCUMENTS

| | | | | |
|---|---|---|---|---|
| 2013/0148407 A1* | 6/2013 | Tsuji | ............... | G11C 13/003 |
| | | | | 365/148 |
| 2013/0272074 A1* | 10/2013 | Tanaka | ............... | G11C 16/28 |
| | | | | 365/189.07 |

* cited by examiner

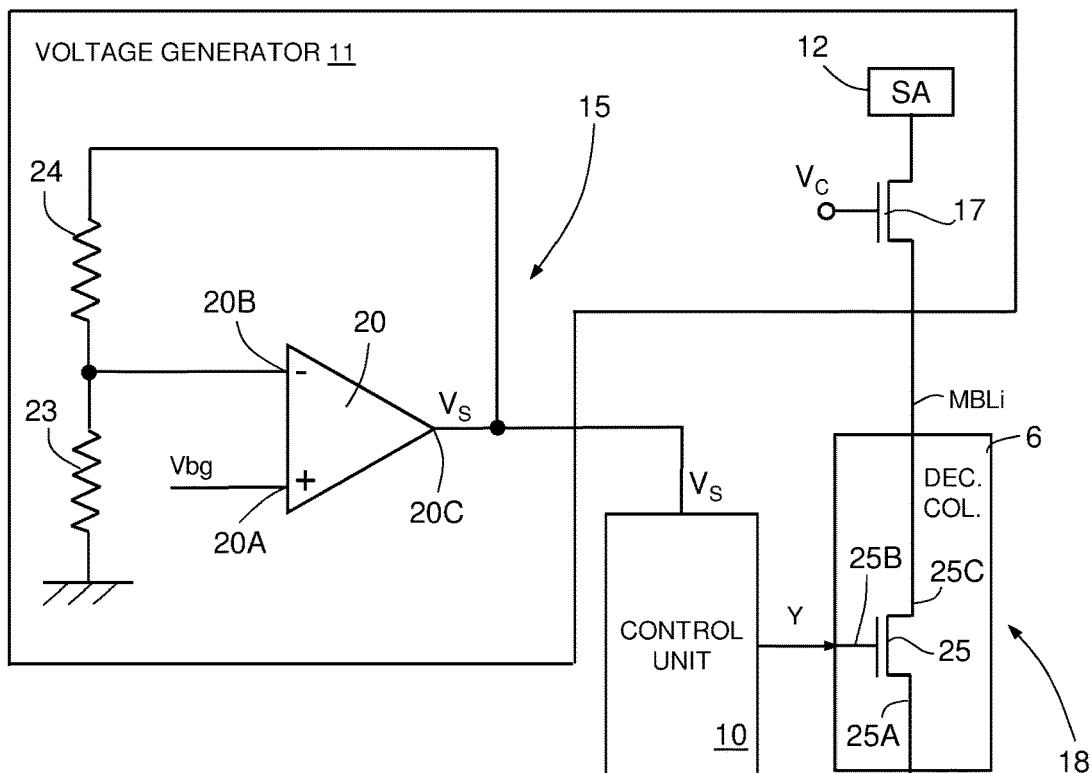
Fig. 2
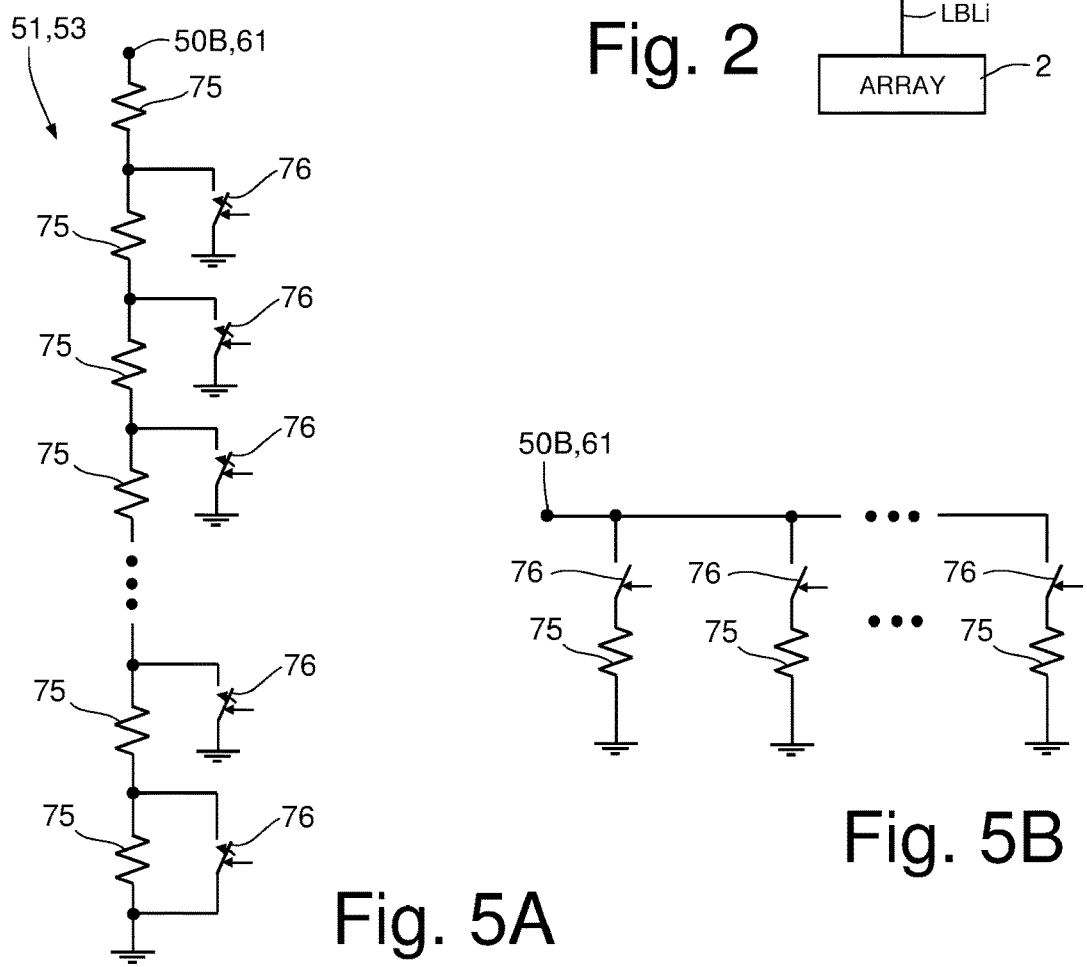
Fig. 5A
Fig. 5B

NON-VOLATILE MEMORY DEVICE HAVING A READING CIRCUIT OPERATING AT LOW VOLTAGE

CROSS-REFERENCE TO RELATED APPLICATIONS

This application claims priority to Italian Patent Application No. 102019000010155, filed on Jun. 26, 2019, which application is hereby incorporated herein by reference.

TECHNICAL FIELD

The disclosure relates to a non-volatile memory device having a reading circuit operating at low voltage.

BACKGROUND

Recently, the use of memory devices manufactured in back-end steps of the process, the storage element whereof is obtained in the last layers of the device, has assumed major importance since it allows to simplify the manufacturing process and consequently reduce the manufacturing costs, thereby allowing memory devices of an embedded type to be obtained, possibly integrated in a same die with other circuits and manufactured using an advanced CMOS technology.

In particular, back-end integration of non-volatile PCM devices becomes increasingly important.

As is known, in PCM devices, the storage element is formed by a region of a material that, when subject to adequate currents, is able to change its physical structure, passing from an amorphous phase to a crystalline phase and vice versa, with consequent variation of its ohmic resistance. This variation of ohmic resistance is used for storing digital data.

The two states of the storage element are known as SET state, associated to the crystalline phase characterized by a lower resistance (and thus, when reading the storage element at constant voltage, by a higher current), and as RESET state, associated to the amorphous phase characterized by a higher resistance (and thus, when reading the storage element at constant voltage, by a lower current).

Currently manufactured embedded PCM devices have components and current paths compatible with supply voltages of a medium value, generally equal to 1.8 V. Recently, however, in view of demands for electronic apparatuses and devices operating at ever lower voltages and/or having an increasingly higher autonomy, it is desirable to develop memory devices that use components operating at low voltage (for example, at 1.2 V). However, this is not simple with current structures, as discussed hereinafter with reference to FIGS. 1 and 2.

As known and as shown schematically in FIG. 1, a non-volatile memory device, designated by 1, here of a PCM type, basically comprises a memory array 2 formed by a plurality of memory cells 3, arranged in rows and columns and storing respective data.

In case of the PCM implementation considered here, each memory cell 3 is formed by a storage element 4 of a PCM type, designed to store a binary datum, and by a selection element 5, here formed by an NMOS transistor, in series with the storage element 4. The selection elements 5 of memory cells 3 arranged on a same row have gate terminals coupled together and to a same wordline WL0, WL1, .... The selection elements 5 of memory cells 3 arranged on a same column have respective first conduction terminals coupled to each other and to a same local bitline LBL1, ..., LBLi, ... through the respective storage elements 4. Moreover, each selection element 5 has a second conduction terminal, coupled to a reference potential line (for example, ground).

The local bitlines LBL0, ..., LBLi, ..., are coupled to a column decoder stage 6, shown in a simplified way, in turn coupled to a biasing and reading circuit 7, whereof just a voltage generating stage 11 and a sense amplifier stage 12 are shown schematically. The wordlines WL0, WL1, ... are coupled to a row decoder stage 8 shown schematically. In a known way, the biasing and reading circuit 7, the column decoder stage 6, and the row decoder stage 8 enable selection each time of one or more memory cells 3, based on selection signals generated by a control unit 10.

In the example shown in FIG. 1, the memory 1 has a bitline structure of a hierarchical type (in the simplified example, with two levels, but one or more levels could be envisaged), wherein the local bitlines LBL1, ..., LBLi, ... are coupled, through first switches 13.0, 13.1, ..., to global bitlines (also referred to as main bitlines) MBL0, MBL1, ..., in turn coupled to the biasing and reading circuit 7 through second switches 14.0, 14.1, .... In the schematic representation of FIG. 1, the first switches 13.0, 13.1, ... (also referred to hereinafter simply as first switches 13), the second switches 14.0, 14.1, ... (also referred to hereinafter simply as second switches 14), and the global bitlines MBL0, MBL1, ... form the column decoder stage 6. The switches 13, 14 receive selection signals YO0, YO1, ..., YN<0>, YN<1>, ..., referred to hereinafter generically as selection signals Y.

The selection signals Y are logic signals, generated by the control unit 10 and having a value depending upon a supply voltage supplied by the voltage generating stage 11 and referred to as column decoding read supply voltage Vs in FIG. 1.

In a per se known manner, the global bitlines MBL0, MBL1, ..., the column decoder stage 6, and the local bitlines LBL1, ..., LBLi form read paths 18, which can be activated individually or in parallel, each intended to create a conductive path between the memory cells 3 of the memory array 2 selected each time and the sense amplifier stage 12. The latter is generally of a differential type and is configured to compare the current(s) circulating in the memory cell(s) 3 that has been selected with a reference current to determine the value of the stored datum or data and generate a digital read signal having one or more bits.

The voltage generating stage 11 has the task of generating the voltages used by all the other stages of the non-volatile memory device 1 during the various operating steps and, in particular here, of generating the column decoding read supply voltage Vs referred to above. Hereinafter, then, only the part regarding generation of the column decoding read supply voltage Vs will be described and discussed, with reference to FIG. 2.

In particular, FIG. 2 shows a read voltage generating circuit 15, and the following description refers to selection of a single current path 18, shown schematically. What discussed may, however, be applied analogously to simultaneous selection and reading of a number of current paths 18, as evident to a person skilled in the art.

In FIG. 2, the column decoder stage 6 is represented by a single transistor 25 (which represents the switches 13, 14 and other possible selection switches of FIG. 1), which has a first terminal 25A connected to a local bitline LBLi, a control terminal 25B receiving a selection signal Y (as said, in general formed by two or three hierarchical selection signals), and a second terminal 25C connected to a global bitline MBLi.

The read voltage generating circuit 15 uses a band-gap voltage Vbg generated by a band-gap circuit (not shown) and comprises an operational amplifier 20 having a non-inverting input 20A, an inverting input 20B, and an output 20C. The non-inverting input 20A receives the band-gap voltage Vbg, the inverting input 20B is coupled to a ground line through a first resistor 23 and to the output 20C through a second resistor 24, and the output 20C is coupled to and supplies the control unit 10 with the column decoding read supply voltage $V_S$. The control unit 10 then generates the selection signals Y having same amplitude as voltage $V_S$, in a known way, for selecting, in the considered example, the read path 18.

The read voltage generating circuit 15 further comprises a cascode element 17 formed by a MOS transistor arranged between the sense amplifier stage 12 and the column decoder stage 6. In particular, in the shown representation regarding a single current path 18, the cascode element 17 is coupled to the global bitline MBLi. Moreover, as discussed hereinafter, the cascode element 17 receives on its gate terminal a cascode control voltage $V_C$ of appropriate value, also generated by the voltage generating stage 11 in a way not shown.

In the read voltage generating circuit 15, the resistors 23 and 24 define the value of the column decoding read supply voltage $V_S$ that enables safe control of the switches of the column decoder stage 6. Furthermore, the cascode element 17 regulates the voltage on the global bitline MBL (and thus on the read path 18) at a regulated and stable value, compensating variability of the electrical characteristics of the read path 18 in real memory devices 1.

In the circuit of FIG. 2, the value of the column decoding read supply voltage $V_S$ is to be sufficiently high to prevent the read path 18 from being resistive, whereas the cascode control voltage $V_C$ limits and regulates the voltage on the memory cells 3 selected each time. Therefore, the value of the column decoding read supply voltage $V_S$ is generally chosen rather high so as to take into account the variability of the electrical characteristics of the memory device 1, including the column decoder stage 6, also taking into account the variability linked to the operation conditions, in particular temperature.

Consequently, the high value of the column decoding read supply voltage $V_S$ may cause stress conditions on the selection devices of the read paths 18 towards the memory cells 3, in particular in case of use of low-voltage selection devices and/or not very resistive read paths.

SUMMARY

The disclosure relates to a non-volatile memory device having a reading circuit operating at low voltage. Particular embodiments relate to a phase change memory (PCM) device, for example, to a PCM device of an embedded type. The invention is not limited thereto.

Embodiments of the present invention provide a voltage generating circuit having improved performance.

In embodiments, the present memory device has a dedicated circuit for regulating the column decoding voltage, which is able to generate a voltage having a minimum value that allows for a predefined value of the voltage on the memory cell to be read when a current of a predefined value flows in the read path. To this end, the regulation circuit uses a dummy decoding stage having the same electrical characteristics as the read path (or electrical characteristics in a preset and known ratio therewith), so as to adapt to the specific memory device and to the existing working conditions, compensating for variability intrinsic in manufacturing processes and in the operating conditions (for example, in the operating temperature).

Thereby, it is no longer necessary to have a cascode device on the read path, and the value of the supply voltage generated is, to a first approximation, the minimum value that enables correct reading of the memory cells. In this way, not only is it possible to use components designed for working at low voltage, but, even with components operating at a medium supply voltage, stress conditions may be avoided on the components on the read path that have characteristics that do not require high supply voltage.

BRIEF DESCRIPTION OF THE DRAWINGS

For a better understanding of the present invention, embodiments thereof are now described, purely by way of non-limiting example, with reference to the attached drawings, wherein:

FIG. 2 shows in greater detail the circuit diagram of some stages of the memory device of FIG. 1;

FIG. 5A shows a possible implementation of components of the stage of FIG. 3A or FIG. 4; and FIG. 5B shows another possible implementation of components of the stage of FIG. 3A or FIG. 4.

DETAILED DESCRIPTION OF ILLUSTRATIVE EMBODIMENTS

Figure 3B:
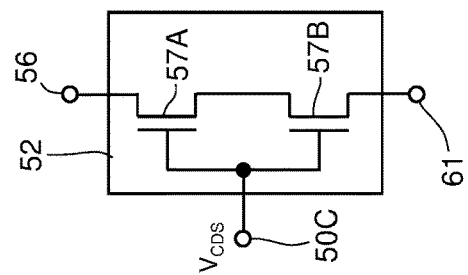
FIG. 3B shows in detail a possible implementation of a component of the voltage generating stage of FIG. 3A.
Figure 3A:
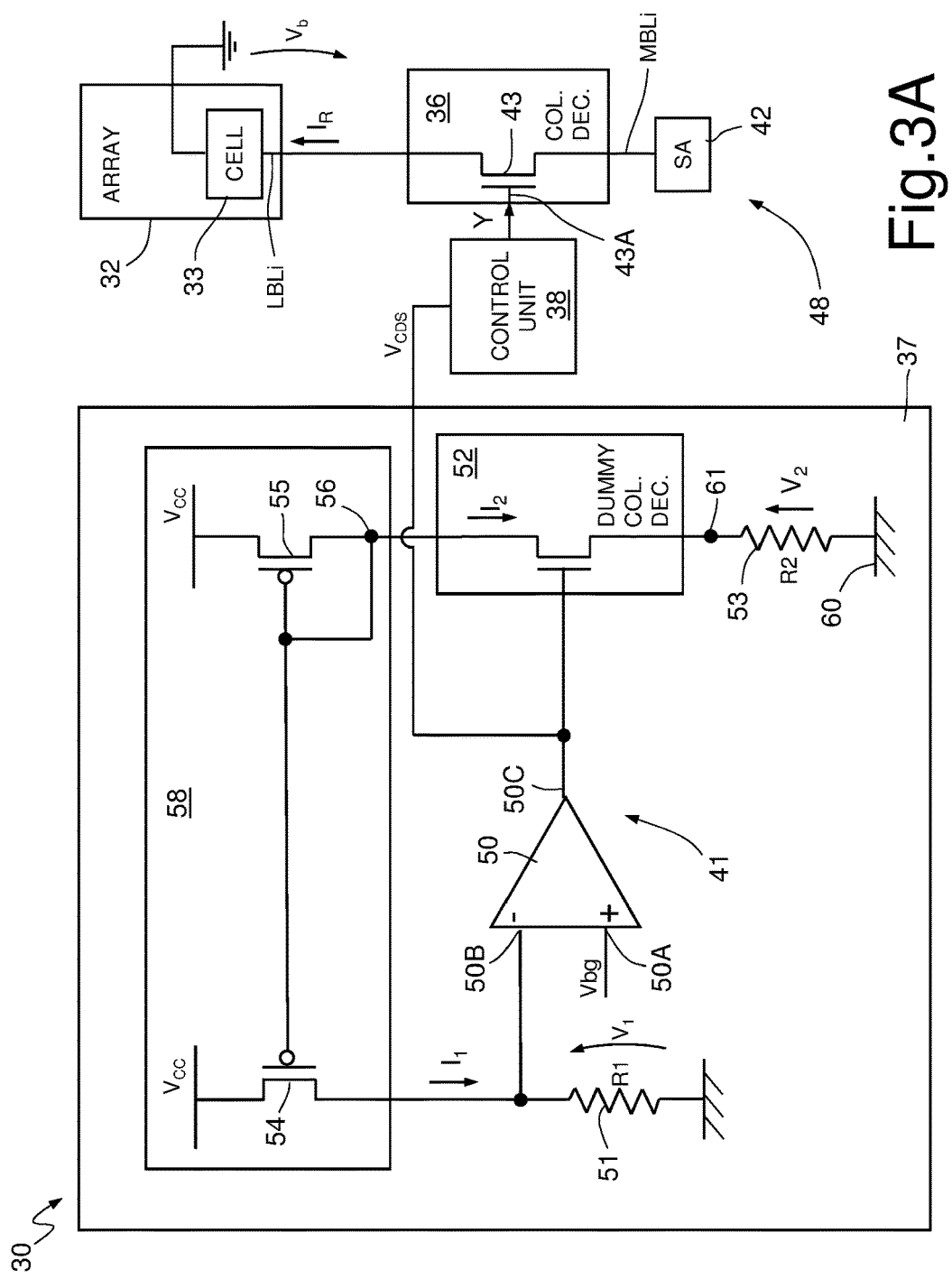
FIG. 3A shows a simplified circuit diagram of the present memory device having a voltage generating stage.

FIG. 3A shows a memory device 30. The memory device 30 is of a non-volatile type, here of the phase change type. The memory device 30 has a general structure similar to the one shown in FIG. 1, so that some blocks are not shown and others are represented only schematically. For these parts, reference is made to FIG. 1.

The memory device 30 shown in FIG. 3A comprises a memory array 32, a column decoder stage 36, a sense amplifier stage 42, a biasing stage 37, and a control unit 38.

Figure 1:
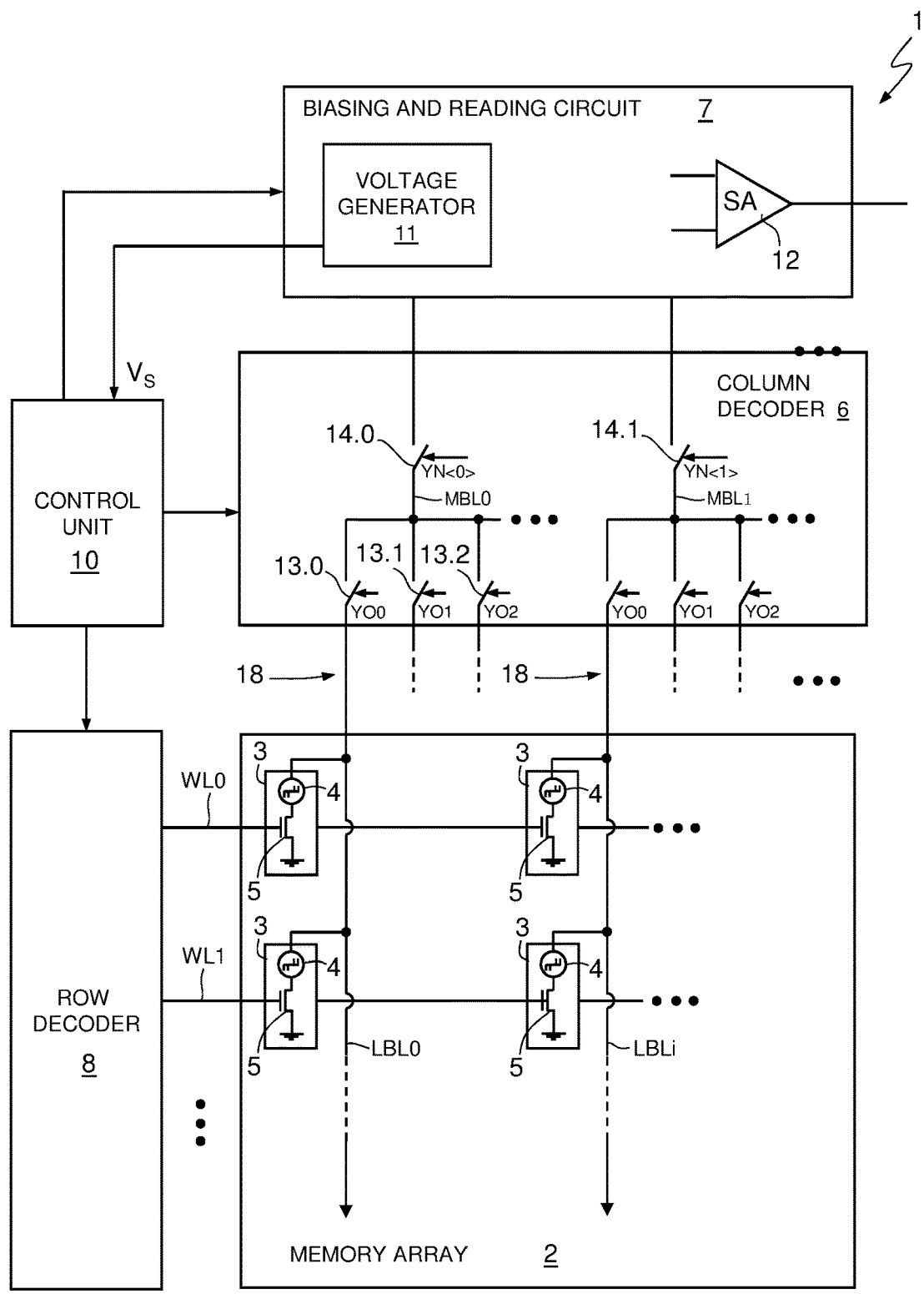
FIG. 1 is a shows schematically the structure of a known non-volatile memory device.

The memory array 32 is formed by a plurality of memory cells 33 (just one whereof shown), which store respective data and have the structure of the memory cells 3 of FIG. 1. As in FIG. 1, and in a way not shown, the memory cells 33 are arranged in rows and columns. The memory cells 33 arranged on a same column are connected to each other and to a same bitline (only one generic local bitline LBLi being shown). The bitlines are coupled to the column decoder stage 36.

In a way not shown and as in FIG. 1, the column decoder stage 36 may be of a hierarchical type, having the structure represented in FIG. 1, with local bitlines (here the generic local bitline LBLi) coupled, through switches (just one selection switch 43 being shown, coupled, through a selection terminal 43A, to the control unit 38) to main bitlines (just one generic main bitline MBLi being shown).

In a per se known manner and analogously to what described for FIG. 1, the main bitline MBLi, the column decoder stage 36, and the local bitline LBLi form, during reading, one or more read paths 48, activatable individually or in parallel, and each intended to create a conductive path between the memory cell 33 of the memory array 32 selected each time and the sense amplifier stage 42. The latter may be of a differential type to compare the current circulating in the selected memory cell 33 with a reference current to determine the stored datum value and generate a corresponding digital read signal, in a per se known manner.

The biasing stage 37 has the task of generating the voltages used by all the other stages of the memory device 30 during the various operating steps. In particular, the biasing stage 37 comprises a column decoding voltage generating circuit 41, configured (during a reading step of the memory cells 33) to generate a column decoding read supply voltage $V_{CDS}$ supplied to a control unit 38, which, according to the cells 33 to be selected in the memory array 32, generates selection signals Y for the selection transistors of the column decoder stage 36. The selection signals Y have an amplitude equal to the column decoding read supply voltage $V_{CDS}$ and a logic value such as to select the desired read path or paths.

The column decoding voltage generating circuit 41 uses a reference voltage Vbg generated by a band-gap circuit (not shown) and comprises an operational amplifier 50 having a non-inverting input 50A, an inverting input 50B, and an output 50C. The non-inverting input 50A receives the reference voltage Vbg; the inverting input 50B is coupled to a reference potential line 60 (ground) through a first resistor 51 having resistance R1; the output 50C is coupled to and supplies the control unit 38 with the column decoding voltage $V_{CDS}$. The voltage across the first resistor 51 is denoted hereinafter by V1.

The column decoding voltage generating circuit 41 further comprises a current mirror circuit 58, a dummy column decoder 52, and a second resistor 53.

In detail, the current mirror circuit comprises a first transistor 54 and a second transistor 55, which are both PMOS transistors, having, for example, the same area and the same electrical characteristics. Alternatively, the two transistors 54, 55 may have a preset ratio area so as to supply currents that are in a known preset ratio. The first transistor 54 has a source terminal coupled to a supply line Vcc, a drain terminal coupled to the inverting terminal 50B of the operational amplifier 50, and a gate terminal coupled to the gate terminal of the second transistor 55. The second transistor 55 has a source terminal coupled to the supply line Vcc, a drain terminal coupled to a first intermediate node 56, and gate and drain terminals coupled together (diode connection).

The second resistor 53 is coupled between the ground line 60 and a second intermediate node 61 and has a resistance R2. The voltage across it is denoted hereinafter by V2 and corresponds to a desired regulated value for the selected local bitline LBLi, as discussed in detail hereinafter.

The dummy column decoder 52 is formed by a plurality of switches corresponding to the switches existing in the column decoder stage 36 on the read path 48 so as to have one switch for each decoding level of the column decoder stage 36. For instance, in case of a hierarchical column decoder stage 36 with two switches formed by two decoding transistors similar to the switches 13, 14 of FIG. 1, the stage, in FIG. 3A, is formed by two dummy switches arranged in series, as shown by way of example in the detail of FIG. 3B. Here, the dummy column decoder 52 comprises two dummy decoding transistors 57A, 57B, similar in number, structure, and design electrical characteristics to the decoding switches 13, 14 of FIG. 1.

In general, the dummy decoding transistors 57A, 57B may be equal in number and structure and have an electrical resistance in a well-defined ratio with the decoding switches 13, 14; for example, they may have twice the resistance so that, by conducting half of the current, they have the same voltage drop, or they may have half the resistance so that, by conducting twice the current, they have the same voltage drop. Alternatively, the dummy decoding transistors 57A, 57B may have the same structure and electrical resistance as the decoding switches 13, 14 but their number is in a given ratio with the number of the decoding switches 13, 14. For instance, for each decoding switch 13, 14, two dummy decoding transistors may be provided to have twice the electrical resistance; in this case, the column decoding voltage generating circuit 41 is configured so that, at the desired column voltage, they conduct half the current, as explained hereinafter.

The dummy decoding transistors 57A, 57B may be arranged in the die integrating the memory device 30 adjacent to the column decoder stage 36 to share the integration and operative conditions.

In FIG. 3B, the dummy decoding transistors 57A, 57B are coupled between the first and the second intermediate nodes 56, 61, have gate terminals coupled together and to the output 50C of the operational amplifier 50 and receive the column decoding voltage $V_{CDS}$.

In practice, the current mirror circuit 58 forms a feedback circuit coupled between the output 50C and the inverting input 50B of the operational amplifier 50.

The column decoding voltage generating circuit 41 is configured to generate a regulated value of the column decoding read supply voltage $V_{CDS}$ to maintain the voltage on the selected local bitline LBLi (designated by Vb in FIG. 3A) at the set value.

To this end, when designing the memory, once the value V2 on the second resistor 53 (desired regulated value for the selected local bitline LBLi—associated to the desired current value $I_R$ flowing in the selected read path 48, referred to a particular operating condition of the memory cells, for example the maximum value of current drawn from a set memory cell equal, to a first approximation, to the value of the current in the resistor 51) has been fixed through the value of resistance R2, as well as the value of the current I1 flowing through the first resistor 51, the value of resistance the first resistor 51 derives therefrom. In the design stage, it is thus verified that the column decoding read supply voltage $V_{CDS}$ is compatible with the used switches 43.

As an alternative to having a current value in the resistor 51 equal (to a first approximation) to the desired current value $I_R$, the current I1 that flows through the first resistor 51 may have a preset ratio with the desired current $I_R$, for example be one half or twice thereof, by correspondingly sizing the rest of the circuit (including the current mirror circuit 58, the dummy column decoder 52, etc.).

Moreover, since the current mirror circuit 58 forces the current I2 flowing in the second resistor 53 to be equal to I1 (or in any case in a preset ratio thereto), the second resistor 53 determines the value Vb of the voltage on the selected bitline LBLi as voltage V2, due to the same electrical characteristics of the dummy column decoder 52 and the selected read path 48. For instance, in case of a memory device 30 obtained using low-voltage components (LV transistors), such as LV transistors operating with a supply voltage Vcc of 1.2 V, $I_R$ may be equal to 10 µA and the bitline voltage Vb may be comprised between 400 mV and 600 mV, for example be 600 mV.

In the shown column decoding voltage generating circuit 41, the operational amplifier 50, by virtue of the feedback implemented by the current mirror circuit 58, automatically supplies, on the output 50C, the column decoding read supply voltage $V_{CDS}$ corresponding to the preset bitline voltage Vb.

The column decoding voltage generating circuit 41 regulates itself to generate the minimum column decoding read supply voltage $V_{CDS}$ that maintains the desired values of read voltage and read current on the selected read path also when the memory 30 has electrical characteristics that differ from the nominal design values or when, during operation, due to the variability of external conditions, such as temperature, the circuit operates in different conditions from the initial ones.

In fact, if for example the switches in the column decoder stage 36 (and thus the switches 57A, 57B in the dummy column decoder 52, manufactured with the same technology and the same parameters, and thus presumably having the same electrical behavior) tend to conduct a higher current (for example, upon a temperature variation) at the preset bitline voltage $V_b$, also the current I2 flowing through the second resistor 53 and the current I1 mirrored by the current mirror circuit 58 towards the first resistor 51, as well as the voltage V1 across it, increase. The inverting input 50B of the operational amplifier 50 reaches a higher value than the non-inverting input 50A, and the operational amplifier 50 modifies its operating point so as to reduce the column decoding voltage $V_{CDS}$.

Figure 4:
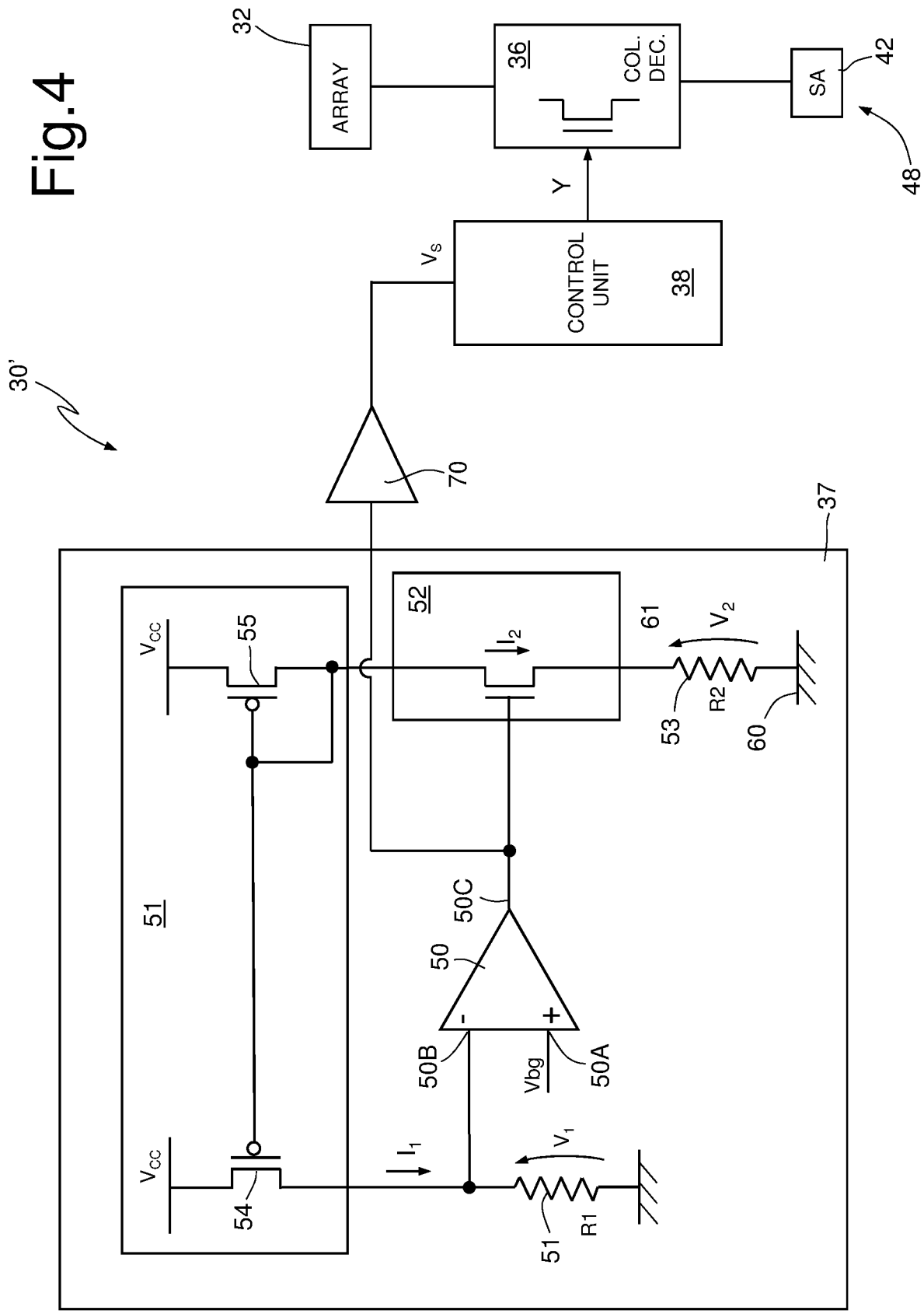
FIG. 4 shows another simplified circuit diagram of the present memory device.

FIG. 4 shows a variant of the memory device 30 of FIG. 3A, here designated by 30'. Here, the output 50C of the operational amplifier 50 is connected to the control unit 38 through an output buffer 70. The output buffer 70 may be formed by a standard voltage follower circuit, having a high current capacity, according to the requirements of the column decoder stage 36. This solution is advantageous with memory devices 30' having a very large column decoder stage 36, with a plurality of simultaneously active read paths 48. In this case, the output buffer 70 can supply the necessary current levels and is able to correctly drive the column decoder stage 36.

For the rest, the memory device 30' of FIG. 4 is identical to the memory device 30 of FIG. 3A, so that the other stages and components are designated by the same reference numbers and will not be described any further.

FIG. 5A shows a possible implementation of the second resistor 53 as a configurable resistance element. In particular, here the second resistor 53 is formed by a plurality of resistive elements 75 arranged in series between the second intermediate node 61 and ground 60. The resistive elements 75 may have the same resistance, for example R2/N, where N is the number of resistive elements 75. Each node between two adjacent resistive elements 75 may be grounded through a respective controllable switch 76.

Each controllable switch 76 has a control terminal coupled to a logic unit (for example, the control unit 38), which, based on the desired resistive value for the second resistor 53, controls closing of one of the controllable switches 76. Thereby, it is possible to modify the value of the resistance R2 of the second resistor 53, for example during characterization and/or final testing of the memory device 30, 30', based on the effective and/or desired electrical characteristics of the components.

Alternatively, each resistive element 75 may be connected in parallel to a respective controllable switch 76. In this case, the resistance of each resistive element 75 may be different, for example in a constant ratio to that of an adjacent resistor.

According to another embodiment (shown in FIG. 5B), the resistive elements 75 can be coupled in parallel through respective switches 76, as shown in FIG. 5B.

The first resistor 51 may have the same structure, to provide a wide variability of the current values I1 to be set.

The advantages of the column decoding voltage generating circuit 41 described herein are evident from the foregoing.

It is emphasized in particular that adaptation of the operating point of the column decoding voltage generating circuit 41 is obtained without any need to insert a further cascode element along the read path 48 of the selected cells, and thus the column decoding voltage generating circuit 41 may be used also in memory devices with low supply voltage (for example, equal to 1.2 V).

In addition, the absence of cascode elements directly on the read path 48 enables a faster reading accessibility to the memory array 32.

With the present memory device, also a reduction of the area of the memory device 30 is obtained due to the absence of a plurality of cascode elements, one for each sense amplifier stage 12 (FIG. 2).

Furthermore, self-regulation of the column decoding read supply voltage $V_{CDS}$ allows to avoid stressing of the components of the memory device 30 when the latter is able to work with a column decoding read supply voltage $V_{CDS}$ of low value, albeit maintaining the capacity to correctly drive the column decoder stage 36 even in the less frequent cases where the memory device 30 requires a higher column decoding read supply voltage $V_{CDS}$.

The shown solution may advantageously be applied also to memory devices using a medium supply voltage, with the above advantages in terms of area, reduction of stresses, and reading speed.

Finally, it is clear that modifications and variations may be made to the memory device described and shown herein, without thereby departing from the scope of the present invention, as defined in the attached claims. For instance, the various embodiments described may be combined to provide further solutions.

What is claimed is:

1. A non-volatile memory device, comprising:
a memory array having a plurality of memory cells;
a reading circuit;
a column decoder stage coupled between the memory array and the reading circuit, the column decoder stage comprising a plurality of selectable bitlines and a plurality of selection switches, each switch being associated with a respective bitline, wherein the plurality of selectable bitlines and the plurality of selection switches are configured, when selected, to couple the memory cell to the reading circuit thereby defining a selected read path; and
a read supply voltage generator comprising a voltage regulation circuit and a dummy column decoder, the dummy column decoder coupled to an output of the voltage regulation circuit and having electrical characteristics correlated to the selected read path, wherein the voltage regulation circuit is configured to receive a first electrical quantity correlated to a desired voltage value on a selected selectable bitline and a second electrical quantity correlated to a desired current value for the selected selectable bitline and to generate a regulated read supply voltage for the column decoder stage, wherein the regulated read supply voltage can be used to control the column decoder stage to supply the selectable bitline, when selected, with the desired voltage value at the desired current value.

2. The non-volatile memory device according to claim 1, wherein the voltage regulation circuit comprises an operational amplifier and a feedback circuit;

wherein the operational amplifier has a first input, a second input, and an output;

wherein the first input of the operational amplifier is configured to receive an electrical reference quantity;

wherein the second input of the operational amplifier is coupled to the output of the operational amplifier through the feedback circuit and is configured to receive the second electrical quantity; and wherein the output of the operational amplifier is coupled to the dummy column decoder and to the output of the read supply voltage generator.

3. The non-volatile memory device according to claim 2, further comprising a voltage set resistor coupled between the dummy column decoder and a reference potential line, the voltage set resistor configured to set the first electrical quantity.

4. The non-volatile memory device according to claim 2, further comprising a current set resistor coupled between the second input of the operational amplifier and a reference potential line, the current set resistor configured to generate the second electrical quantity.

5. The non-volatile memory device according to claim 4, further comprising a voltage set resistor coupled between the dummy column decoder and the reference potential line, the voltage set resistor configured to set the first electrical quantity.

6. The non-volatile memory device according to claim 5, wherein the voltage set resistor or the current set resistor has an adjustable resistance.

7. The non-volatile memory device according to claim 6, wherein the voltage set resistor or the current set resistor comprises a plurality of selectable resistive elements coupleable together, each selectable resistive element having a respective connection switch.

8. The non-volatile memory device according to claim 2, wherein the dummy column decoder comprises a first terminal coupled to the feedback circuit, a second terminal configured to receive the first electrical quantity, and a control terminal coupled to the output of the operational amplifier.

9. The non-volatile memory device according to claim 8, wherein the column decoder stage has a number of decoding levels and the dummy column decoder comprises a number of series-connected dummy decoding transistors equal to the number of decoding levels of the column decoder stage.

10. The non-volatile memory device according to claim 9, wherein at least one of the dummy decoding transistors has a control terminal coupled to the output of the operational amplifier.

11. The non-volatile memory device according to claim 2, wherein the feedback circuit comprises a current mirror circuit.

12. The non-volatile memory device according to claim 1, further comprising a current buffer coupled to the output of the voltage regulation circuit.

13. The non-volatile memory device according to claim 12, wherein the current buffer comprises a voltage-follower circuit.

14. The non-volatile memory device according to claim 1, wherein each of the memory cells comprises a phase-change memory cell.

15. A method for reading a memory device comprising a memory array having a memory cell and a reading circuit, the method comprising:

selecting a bitline using a column decoder;

coupling the memory cell to the reading circuit through the selected bitline;

acquiring a first electrical quantity correlated to a desired voltage value on the selected bitline and a second electrical quantity correlated to a desired current value for the selected bitline;

generating a regulated read supply voltage through a voltage regulation circuit coupled to a dummy circuit having electrical characteristics correlated to a read path between the memory cell and the reading circuit; and supplying the regulated read supply voltage to the column decoder.

16. The method according to claim 15, wherein each of the memory array comprises a plurality of phase-change memory cells, the memory cell being a phase-changed memory cell.

17. A voltage generator circuit for use with a memory device, the circuit comprising:

an operational amplifier having a first input, a second input, and an output, wherein the first input of the operational amplifier is coupled to receive an electrical reference quantity;

a dummy column decoder having a control input coupled to the output of the operational amplifier, wherein the dummy column decoder is designed to have electrical characteristics correlated to a column decoder stage of the memory device;

a feedback circuit coupled between the second input of the operational amplifier and a current path of the dummy column decoder;

a voltage set resistor coupled in series with the current path of the dummy column decoder between the dummy column decoder and a reference potential line; and a current set resistor coupled between the second input of the operational amplifier and the reference potential line.

18. The circuit according to claim 17, wherein the voltage set resistor or the current set resistor has an adjustable resistance.

19. The circuit according to claim 18, wherein the voltage set resistor or the current set resistor comprises a plurality of selectable resistive elements coupleable together, each selectable resistive element having a respective connection switch.

20. The circuit according to claim 17, wherein the dummy column decoder is designed to have electrical characteristics correlated to a selected read path between a selected memory cell and a read circuit of the memory device, the selected read path including a bitline selected by the column decoder stage.

21. The circuit according to claim 17, wherein the dummy column decoder comprises a number of series-connected dummy decoding transistors equal to a number of decoding levels of the column decoder stage.

22. The circuit according to claim 21, wherein at least one of the dummy decoding transistors has a control terminal coupled to the output of the operational amplifier.

23. The circuit according to claim 17, wherein the feedback circuit comprises a current mirror circuit.

* * * * *